(12) United States Patent
Carter et al.

(10) Patent No.: US 6,342,455 B2
(45) Date of Patent: Jan. 29, 2002

(54) PROCESS FOR FORMING AN INTEGRATED CIRCUIT

(75) Inventors: Kenneth R. Carter, San Jose; James L. Hedrick, Pleasanton; Victor Yee-Way Lee, San Jose, all of CA (US); Dale C. McHerron, Staatsburg, NY (US); Robert D. Miller, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/803,520

(22) Filed: Mar. 8, 2001

Related U.S. Application Data

(62) Division of application No. 09/330,285, filed on Jun. 11, 1999, now Pat. No. 6,265,753.

(51) Int. Cl.[7] .................... H01L 21/31; H01L 21/469; G03C 5/00
(52) U.S. Cl. .................... 438/781; 438/780; 430/313; 430/317
(58) Field of Search .................... 438/778, 780, 438/781, 622, 623; 430/311, 313, 317

(56) References Cited

U.S. PATENT DOCUMENTS

| | | | |
|---|---|---|---|
| 3,926,914 A | * 12/1975 | Mivadera et al. | 260/47 |
| 5,138,028 A | 8/1992 | Paul et al. | 528/353 |
| 5,773,197 A | 6/1998 | Carter et al. | 430/313 |
| 5,895,263 A | * 4/1999 | Carter et al. | 438/624 |
| 6,093,636 A | * 7/2000 | Carter et al. | 438/623 |
| 6,265,753 B1 | * 7/2001 | Carter et al. | 257/508 |

FOREIGN PATENT DOCUMENTS

WO    WO 97/10193    3/1997

OTHER PUBLICATIONS

John et al. (1994), "Synthesis of Polyphenylenes and Polynaphthalenes by Thermolysis of Enediynes and Dialkynylbenzenes," *J. Am. Chem. Soc.* 116:5011–5012, No month.

* cited by examiner

*Primary Examiner*—Alexander G. Ghyka
(74) *Attorney, Agent, or Firm*—Reed & Associates

(57) ABSTRACT

A novel dielectric composition is provided that is useful in the manufacture of integrated circuit devices and integrated circuit packaging devices. The dielectric composition is prepared by imidizing and curing an oligomeric precursor compound comprised of a central polybenzoxazole, polybenzothiazole, polyamic acid or polyamic acid ester segment end-capped at each terminus with an aryl-substituted acetylene moiety such as an ortho-bis (arylethynyl)aryl group, e.g., 3,4-bis(phenylethynyl)phenyl. Integrated circuit devices, integrated circuit packaging devices, and methods of synthesis and manufacture are provided as well.

15 Claims, 2 Drawing Sheets

PROCESS FOR FORMING AN INTEGRATED CIRCUIT

CROSS REFERENCE TO RELATED APPLICATIONS

This is a divisional of U.S. patent application Ser. No. 09/330,285, filed Jun. 11, 1999 now U.S. Pat. No. 6,265,753.

TECHNICAL FIELD

This invention relates generally to dielectric materials and their use in integrated circuits. More particularly, the invention pertains to novel dielectric polymer compositions, oligomeric precursors and methods for preparing the compositions, and integrated circuit devices fabricated therewith.

BACKGROUND

Polyimides are known in the art for use in the manufacture of integrated circuits including chips (e.g., chip back end of line, or "BEOL"), thin film packages, and printed circuit boards. Polyimides are useful in forming dielectric interlayers, passivation layers, alpha particle barriers, and stress buffers. Polyimides are particularly useful as an interlayer dielectric material to insulate the conductor wiring interconnecting the chips on a multichip module. This is known as "thin film" wiring. Multichip modules represent an intermediate level of packaging between the chips and the circuit board, and are generally known in the art. Multichip modules are made up of multiple layers of power, signal, and ground planes which deliver power to the chips and distribute the input/output signals between chips on the module or to and from the circuit board.

There is a continuing desire in the microelectronics industry to increase the circuit density in multilevel integrated circuit devices, e.g., memory and logic chips, thereby increasing performance and reducing cost. In order to accomplish these goals, those in the field are striving to reduce the minimum feature sizes, e.g., metal lines and vias, and to decrease the dielectric constant of the interposed dielectric material to enable closer spacing of circuit lines without a concomitant increase in crosstalk and capacitive coupling. Polyimides usually have dielectric constants of about 3.0–3.8 and mechanical and thermal properties sufficient to withstand present processing operations including the thermal cycling associated with semiconductor manufacturing. However, there is a need in the art for a dielectric material that would be suitable for use in integrated circuit devices, wherein the material exhibits a lower dielectric constant (e.g., <3.0) than typically exhibited by polyimides and has improved mechanical and thermal properties.

The invention is addressed to the aforementioned need in the art, and, in one embodiment, provides a novel dielectric composition that represents a significant improvement over prior dielectric materials used in integrated circuit devices. The composition is formed by imidizing and curing an oligomeric precursor compound comprised of a central polyamic acid or polyamic acid ester segment terminated at each end with an aromatic species substituted with two or more aryl-substituted ethynyl moieties. These oligomeric compounds, dielectric compositions formed therefrom, and associated methods of manufacture and use will be discussed in detail herein.

Compounds that are end-capped with two or more diaryl-substituted acetylene moieties at each of two termini are known and described, for example, in PCT Publication No. WO 97/10193. The reference does not, however, describe end-capped oligomeric segments comprised of polyamic acid, a polyamic acid ester, or the like.

U.S. Pat. No. 5,138,028 to Paul et al. is also of interest insofar as polyimides end-capped with diaryl-substituted acetylene are disclosed. Only one diaryl-substituted acetylene moiety is present at each terminus, resulting in higher curing temperature and less efficient cross linking than possible with the oligomeric precursor compounds of the invention.

John et al. (1994), "Synthesis of Polyphenylenes and Polynaphthalenes by Thermolysis of Enediynes and Dialkynylbenzenes," J. Am. Chem. Soc. 116:5011–5012, is of background interest insofar as the publication describes thermal polymerization of substituted enediynes. U.S. Pat. No. 5,773,197 to Carter et al. is also a background reference that is of interest with respect to the present invention, in that the patent describes the manufacture and use of integrated circuit devices in which a dielectric material contained therein is synthesized on a substrate.

No art of which applicants are aware, however, describes or suggests the dielectric compositions as now provided herein, or the oligomeric precursor compounds that are imidized and crosslinked to form the compositions. In contrast to the dielectric materials of the prior art, the present compositions provide the following advantages: (1) the precursor to the present dielectric compositions has a lower solution viscosity than other polyimide precursors, allowing for superior planarization and gap filling; (2) the present dielectric compositions have a low dielectric constant, less than 3.0, which is lower than that of currently used dielectric materials; and (3) films of the novel dielectric compositions have superior mechanical properties relative to current dielectric materials used in the manufacture of integrated circuit devices and packages. The compositions also find utility in laminates, composites and the like.

SUMMARY OF THE INVENTION

Accordingly, it is a primary object of the invention to address the above-mentioned need in the art by providing novel dielectric materials that are useful, inter alia, in integrated circuit devices.

It is another object of the invention to provide oligomeric precursor compounds useful for preparing the novel dielectric compositions.

It is still another object of the invention to provide such oligomeric precursor compounds comprised of a central oligomeric segment end-capped at each of two termini with an aryl-substituted acetylene moiety such as an ortho-bis (arylethynyl)aryl group.

It is yet another object of the invention to provide such oligomeric precursor compounds wherein the central oligomeric segment is a polyamic acid, a polyamic acid ester, a polybenzoxazole, or a polybenzothiazole.

It is a further object of the invention to provide methods for synthesizing the oligomeric precursor compounds and methods for preparing the novel dielectric compositions therefrom.

It is still a further object of the invention to provide end-capping reagents comprised of aryl-substituted acetylene compounds, suitable for preparing the aforementioned oligomeric precursor compounds.

It is an additional object of the invention to provide an integrated circuit device in which metallic circuit lines on a substrate are electrically insulated from each other by a dielectric material that comprises a dielectric composition of the invention.

Still a further object of the invention is to provide an integrated circuit packaging device (multichip module) that incorporates a dielectric material comprising a dielectric composition of the invention.

Additional objects, advantages and novel features of the invention will be set forth in part in the description which follows, and in part will become apparent to those skilled in the art upon examination of the following, or may be learned by practice of the invention.

In a first embodiment of the invention, then, an oligomeric precursor compound is provided that can be imidized and crosslinked to prepare a dielectric material, the oligomeric precursor compound having the structural formula (I)

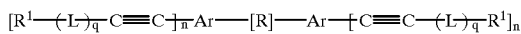

(I)

wherein:
n is an integer of 2 or more;
q is 0 or 1;
R is an oligomeric unit comprised of polyamic acid, a polyamic acid ester, a polybenzoxazole or a polybenzothiazole;
$R^1$ is an aromatic group optionally substituted at one or more available carbon atoms with an inert, nonhydrogen substituent and optionally containing one or more heteroatoms;
L is a linking group, and, as q may be 0, is optional; and
Ar is arylene optionally substituted at one or more available carbon atoms with an inert, nonhydrogen substituent and optionally containing one or more heteroatoms.

In a related embodiment, the invention pertains to end-capping reagents useful in synthesizing the aforementioned oligomeric precursor compounds, wherein the reagents are comprised of aryl-substituted acetylene compounds generally having the structural formula (II)

(II)

wherein $R^1$, L, q, n and Ar are as defined above, and Z is a reactive moiety such as OH, $NH_2$, COOH, halo, or the like.

In another embodiment of the invention, a novel dielectric composition is provided by heating the aforementioned oligomeric precursor in a manner effective to bring about imidization of the central "R" segment of the precursor and crosslinking, or "curing," at the bis(arylethynyl)aryl-substituted termini. Generally, this involves heating to a predetermined temperature, at a predetermined heating rate, and a predetermined heating time. Preferably, the temperature for preparing the dielectric composition from the oligomeric precursor compound is at least about 250° C., more preferably at least about 400° C. The dielectric composition so prepared has a dielectric constant of less than about 3.0, a thermal expansion coefficient of less than $10^{-3}$° $C.^{-1}$, and a number of advantages chemical and mechanical properties, e.g., enhanced mechanical and polishing characteristics, enhanced isotropic optical and dielectrical properties, low thermal film stress, resistance to cracking, increased breakdown voltage, optical clarity, good adhesion to a substrate, and the like.

In a further embodiment of the invention, an integrated circuit device is provided that comprises: (a) a substrate; (b) individual metallic circuit lines positioned on the substrate; and (c) a dielectric composition positioned over and/or between the individual metallic circuit lines, the dielectric composition comprising an imidized, cured oligomer precursor compound, the precursor compound having the structural formula (I), i.e., comprising a polyamic acid segment, polyamic acid ester segment, or the like, capped at each terminus with a moiety —Ar(—C≡C—(L)$_q$—R$^1$)$_n$ wherein Ar, L, q, n, and $R^1$ are as defined above.

Still an additional embodiment of the invention relates to an integrated circuit packaging device providing signal and power current to an integrated circuit chip, the packaging device comprising:
(i) a substrate having electrical conductor means for connection to a circuit board,
(ii) a plurality of alternating electrically insulating and conducting layers positioned on the substrate wherein at least one of the electrically insulating layers is comprised of a dielectric composition comprising an imidized, cured oligomer precursor compound having the structure of formula (I), i.e., comprising a polyamic acid or polyamic acid ester segment capped at each terminus with a moiety —Ar(—C≡C—(L)$_q$—R$^1$)$_n$ wherein Ar, L, q, n, and $R^1$ are as defined above; and
(iii) a plurality of vias for electrically interconnecting the electrical conductor means, the conducting layers and the integrated circuit chip.

DETAILED DESCRIPTION OF THE INVENTION

Figure 1:
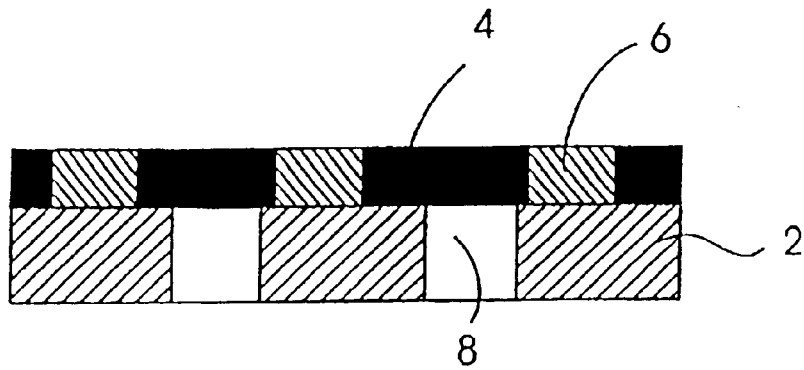
FIG. 1 is a cross-sectional view of a portion of an integrated circuit device of the present invention.

Overview and Definitions:

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, for example, reference to "an oligomeric compound" or "an oligomeric precursor compound" includes more than one such compound, reference to "a substituent" includes more than one substituent, reference to "a layer" includes multiple layers, and the like.

In describing and claiming the present invention, the following terminology will be used in accordance with the definitions set out below.

The term "oligomer" is used to refer to a chemical compound that comprises linked monomers, and that may or may not be linear; in the context of the present invention, the "oligomers" are, however, generally linear. Oligomeric "segments" as used herein refer to an oligomer that is covalently bound to two additional moieties, generally end-capping moieties at each of two termini of the oligomeric "segment." Typically, the oligomeric precursor compounds herein have a number average molecular weight (Me) in the range of approximately 5000 to 20,000 g/mol.

The term "alkyl" as used herein refers to a branched or unbranched saturated hydrocarbon group of 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms.

The term "alkenyl" as used herein refers to a branched or unbranched hydrocarbon group of 2 to 24 carbon atoms containing at least one double bond, typically containing one to six double bonds, more typically one or two double bonds, e.g., ethenyl, n-propenyl, n-butenyl, octenyl, decenyl, and the like, as well as cycloalkenyl groups such as cyclopentenyl, cyclohexenyl and the like. The term "lower alkenyl" intends an alkenyl group of two to six carbon atoms, preferably two to four carbon atoms.

The term "alkynyl" as used herein refers to a branched or unbranched hydrocarbon group of 2 to 24 carbon atoms containing at least one triple bond, e.g., ethynyl, phenylethynyl, n-propynyl, n-butynyl, octynyl, decynyl, and the like, as well as cycloalkynyl groups such as cyclooctynyl, cyclononynyl, and the like. The term "lower alkynyl" intends an alkynyl group of two to six carbon atoms, preferably two to four carbon atoms.

The term "alkylene" as used herein refers to a difunctional branched or unbranched saturated hydrocarbon group of 1 to 24 carbon atoms, such as methylene, ethylene, n-propylene, n-butylene, n-hexylene, decylene, tetradecylene, hexadecylene, and the like. The term "lower alkylene" refers to an alkylene group of one to six carbon atoms, preferably one to four carbon atoms.

The term "alkenylene" as used herein refers to a difunctional branched or unbranched hydrocarbon group of 2 to 24 carbon atoms containing at least one double bond, such as ethenylene, n-propenylene, n-butenylene, n-hexenylene, and the like. The term "lower alkenylene" refers to an alkylene group of two to six carbon atoms, preferably two to four carbon atoms.

The term "alkynylene" as used herein refers to a difunctional branched or unbranched hydrocarbon group of 2 to 24 carbon atoms containing at least one triple bond, such as ethynylene, n-propynylene, n-butynylene, and the like. The term "lower alkynylene" refers to an alkynylene group of two to six carbon atoms, preferably two to four carbon atoms, with ethynylene particularly preferred.

The term "alkoxy" as used herein refers to a substituent —O—R wherein R is alkyl as defined above. The term "lower alkoxy" refers to such a group wherein R is lower alkyl.

The term "aryl" as used herein, and unless otherwise specified, refers to an aromatic moiety containing one to five aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkenyl (preferably lower alkenyl), alkynyl (preferably lower alkynyl), alkoxy (preferably lower alkoxy), alkoxycarbonyl (preferably lower alkoxycarbonyl), carboxy, nitro, cyano and sulfonyl. Unless otherwise indicated, the term "aryl" is also intended to include heteroaromatic moieties, i.e., aromatic heterocycles. Generally, although not necessarily, the heteroatoms will be nitrogen, oxygen or sulfur.

The term "arylene" as used herein, and unless otherwise specified, refers to a bifunctional aromatic moiety containing one to five aromatic rings. Arylene groups are optionally substituted with one or more substituents per ring as set forth above for substitution of an "aryl" moiety.

The term "halo" is used in its conventional sense to refer to a chloro, bromo, fluoro or iodo substituent. In the compounds described and claimed herein, halo substituents are generally fluoro or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom.

The term "heterocyclic" refers to a five- or six-membered monocyclic structure or to an eight- to eleven-membered bicyclic heterocycle. The "heterocyclic" substituents herein may or may not be aromatic, i.e., they may be either heteroaryl or heterocycloalkyl. Each heterocycle consists of carbon atoms and from one to three, typically one or two, heteroatoms selected from the group consisting of nitrogen, oxygen and sulfur, typically nitrogen and/or oxygen. The term "nonheterocyclic" as used herein refers to a compound that is not heterocyclic as just defined.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. Aliphatic and alicyclic hydrocarbyl may be saturated or they may contain one or more unsaturated bonds, typically double bonds. The hydrocarbyl substituents herein generally contain 1 to 24 carbon atoms, more typically 1 to 12 carbon atoms, and may be substituted with various substituents and functional groups.

The term "inert" to refer to a substituent or compound means that the substituent or compound will not be modified either in the presence of the reagents or under the conditions normally employed in the manufacture of integrated circuit devices. As explained above, and as intended throughout, "inert, nonhydrogen substituents" include, but are not limited to, halo, haloalkyl (preferably halo-substituted lower alkyl), alkyl (preferably lower alkyl), alkoxy (preferably lower alkoxy), alkoxycarbonyl (preferably lower alkoxycarbonyl), carboxy, nitro, cyano, silyl, trialkylsilyl, and sulfonyl.

The term "available" to refer to an optionally substituted carbon atom refers to a carbon atom that is covalently bound to one or more hydrogen atoms that can be replaced by a designated substituent without disrupting or destabilizing the remaining structure of the molecule.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

Oligomeric Precursor Compounds:

The dielectric compositions of the invention that are useful, inter alia, in the manufacture of integrated circuit devices, are prepared from an oligomeric precursor compound having the structure of formula (I)

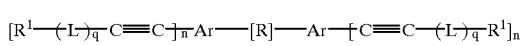

(I)

wherein n, q, R, $R^1$, L and Ar are generally defined above.

More specifically:

Each Ar group is preferably substituted with two —C≡C—(L)$_q$—$R^1$ groups that are ortho to each other on Ar; thus, in the preferred embodiment, n is 2. Ar is heterocyclic or nonheterocyclic arylene optionally substituted at one or more available carbon atoms with an inert, nonhydrogen substituent, as noted above. Preferred Ar groups are nonheterocyclic, including, for example, phenylene, naphthylene, biphenylene, and phenylene, naphthylene and biphenylene optionally substituted at one or more available carbon atoms with an inert, nonhydrogen substituent. In a particularly preferred embodiment, Ar is phenylene.

While the linking group L may be present, it is optional. Thus, q is 0 or 1. Generally and preferably q is 0. When q is 1 and L is, therefore, present, L normally represents a hydrocarbyl linker such as alkylene, alkylene, or the like, optionally substituted with one or more inert nonhydrogen substituents and optionally containing nonhydrocarbyl linkages, e.g., —O—, —S—, —NH—, or the like.

$R^1$ is aromatic, and may be heterocyclic or nonheterocyclic, monocyclic or polycyclic, and substituted at one or more available carbon atoms with an inert, nonhydrogen substituent. Examples of $R^1$ substituents include phenyl, naphthyl, biphenyl, anthranyl, indenyl, furanyl, pyridinyl, pyrimidyl, thiophenyl, benzofuranyl, benzothiophenyl, indolyl, quinolinyl, and the like.

R is an oligomeric unit comprised of polyamic acid, polyamic acid ester, polybenzoxazole, a polybenzothiazole, or the like, preferably polyamic acid or a polyamic acid ester, but in a particularly preferred embodiment is a polyamic acid ester. In the latter case, the oligomeric segment R comprises the reaction product of (a) a diamine, and (b) a diester diacyl halide formed from reaction of a tetracarboxylic dianhydride with a lower alkanol and, subsequently, with a suitable halogenating agent such as an oxalyl halide, thionyl, chloride, and the like. The diamine has the structural formula $H_2N$—$R^2$—$NH_2$ in which $R^2$ is a difunctional monocyclic or bicyclic aromatic moiety, typically although not necessarily selected from the group consisting of

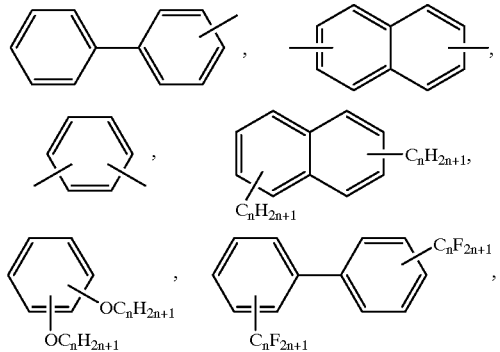

-continued

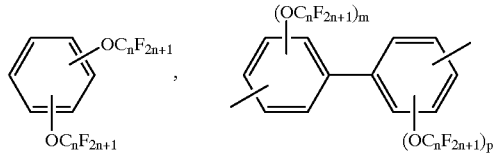

and

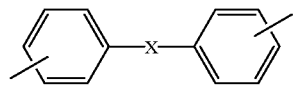

wherein X is lower alkylene, lower alkenylene, carbonyl, O, S, $SO_2$, NH, N(alkyl), N(aryl), dialkylsilyl, phosphonyl, if lower alkylene or lower alkenylene, optionally substituted at one or more available carbon atoms with halogen, halosubstituted lower alkyl or phenyl. Specific $R^2$ groups within the aforementioned include, but are not limited to, the following:

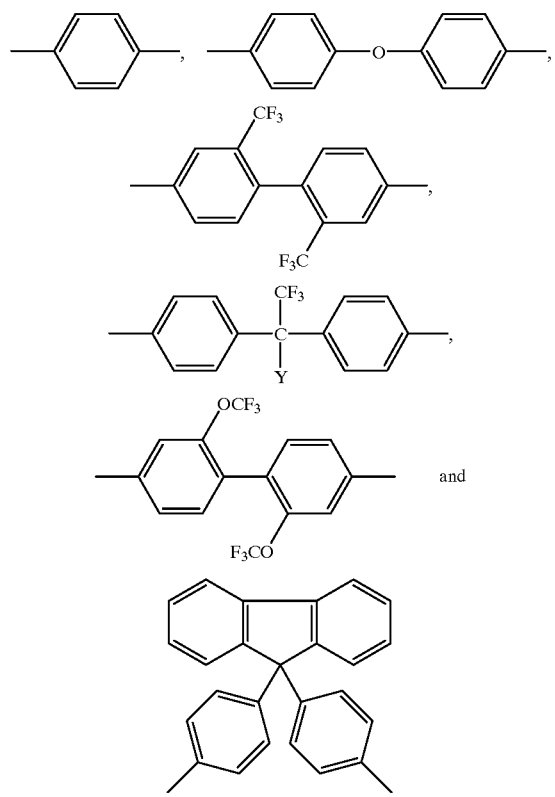

wherein Y is selected from the group consisting of trifluoromethyl, phenyl and phenyl substituted with one or more inert, nonhydrogen substituents, with phenyl preferred. Particularly preferred aromatic diamines include, but are not limited to: p-phenylene diamine; 4,4'-diaminodiphenylamine; benzidine; 4,4'-diamino-diphenyl ether; 1,5-diamino-naphthalene; 3,3'-dimethyl-4,4'diamino-biphenyl; 3,3'dimethoxybenzidine; 1,4-bis(p-aminophenoxy) benzene; 1,3-bis(p-aminophenoxy) benzene; 2,2-bis[4-aminophenyl]hexafluoropropane; 1,1-bis(4-aminophenyl)-1-phenyl-2,2,2-trifluoroethane ("3FDA"); and 9,9-bis(4-aminophenyl) fluorene ("FDA").

The $R^2$ moiety in the diamine may also be an aliphatic or cycloaliphatic group such as cycloalkylene, e.g., cyclohexylene. Suitable aliphatic diamines include 1,4-diaminocyclohexane and bis(4-aminocyclohexyl) methane, 1,4-diamino-2,2,2-bicyclooctane, 1,3-diaminoadamantane, 1,3-bis-p-aminophenyladamantane, etc.

The most preferred diamines for forming the polyamic acid ester segment are 3,3'-bis-trifluoromethoxy benzidine ("TFMOB"), 4,4-oxydianiline and 3,3'-bis-trifluoromethyl benzidine ("BTFB").

The tetracarboxylic dianhydride has the structural formula

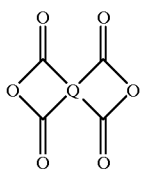

wherein Q is a tetrafunctional aromatic moiety, preferably monocyclic, bicyclic or tricyclic, and is typically selected from the group consisting of

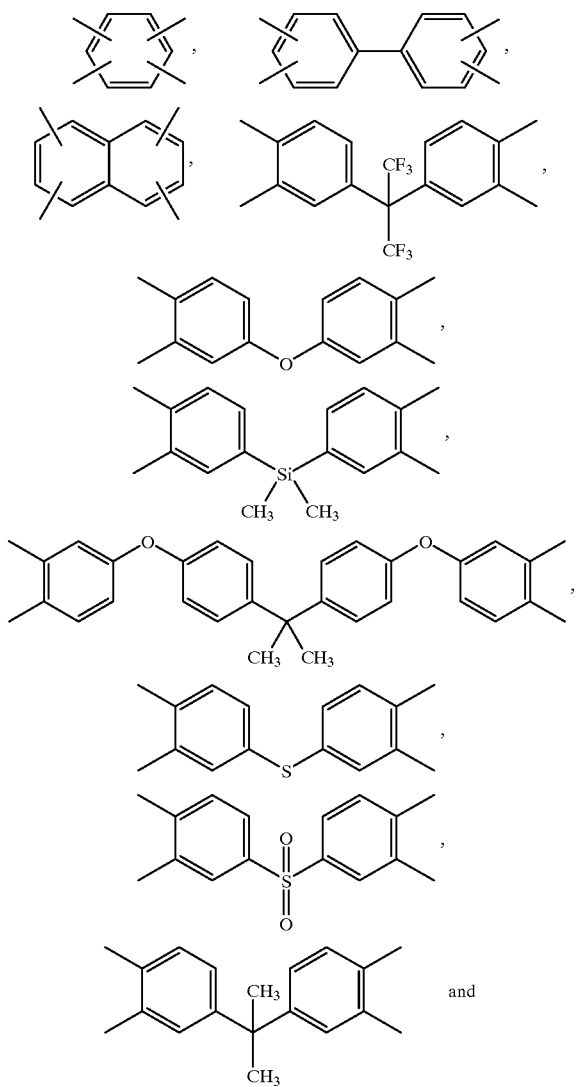

and

-continued

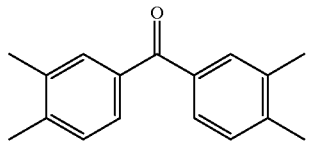

Suitable dianhydrides include, without limitation: pyromellitic dianhydride; benzophenone dianhydride; 2,2-bis(3,4-dicarboxyphenyl) propane dianhydride; 3,3',4,4'-biphenyltetracarboxylic acid dianhydride; bis(3,4-dicarboxyphenyl) ether dianhydride; bis(3,4-dicarboxyphenyl) thioether dianhydride; bisphenol-A bisether dianhydride; 2,2-bis(3,4-dicarboxylphenyl) hexafluoropropane dianhydride; 2,3,6,7-naphthalenetetracarboxylic acid dianhydride; bis(3,4-dicarboxyphenyl) sulfone dianhydride; 1,2,5,6-naphthalene tetracarboxylic dianhydride; 2,2',3,3'-biphenyl tetracarboxylic dianhydride; 9,9-bis-(trifluoromethyl) xanthenetetracarboxylic dianhydride; 9-trifluoromethyl-9-phenyl xanthenetetracarboxylic dianhydride; 3,4,3',4'-benzophenone tetracarboxylic dianhydride; and terphenyldianhydride.

The oligomeric precursor compound (I) is prepared by synthesizing the oligomeric unit R in the presence of a predetermined quantity of an end-capping moiety Z—Ar $(C\equiv C-(L)_q-R^1)_n$, wherein $R^1$, L, q, n and Ar are as defined above, and Z is a reactive moiety such as OH, $NH_2$, COOH, halo, or the like, but is preferably $NH_2$. Generally, this involves an amidization reaction wherein (a) a diamine $H_2N-R^2-NH_2$, as described above, is reacted with (b) a diester diacyl halide formed from reaction of a tetracarboxylic dianhydride, also as described above, with a lower alkanol and halogenating reagent such as an oxalyl halide, in the presence of (c) the end-capping moiety Z—Ar(C≡C—$(L)_q-R^1)_n$. That is, the diester diacyl halide is formed by sequentially reacting the corresponding tetracarboxylic dianhydride with a lower alkanol such as ethanol and a halogenation reagent such as an oxalyl halide, e.g., oxalyl chloride, in the presence of the end-capping moiety. The rate of subsequent imidization can be varied by employing different alcohols and/or different ester substituents, as the electronic substituent effect of various ester substituents (e.g., an ethyl ester substituent as results from reaction with ethanol) will change the reaction rate. Alcohols useful in the aforementioned reaction will be known to those skilled in the art and are disclosed in the pertinent literature and texts, e.g., *Advances in Polymer Science: High Performance Polymers*, ed. Hergenrother (New York: Springer-Verlag, 1994), at page 139. Suitable diester diacyl chlorides are diethyldichloropyromellitate, diethyl dichlorobiphenyl tetracarboxylate and diethyldichloro oxydiphthalate. Other suitable diamines and diester diacyl chlorides will be known to those skilled in the art such as those disclosed in U.S. Pat. No. 4,720,539 and copending commonly assigned U.S. patent application Ser. No. 08/058,303 filed May 10, 1992, now U.S. Pat. No. 5,464,977.

In synthesizing the oligomeric compound (I), the diamine, the diester diacyl halide and the end-capping reagent are dissolved in a suitable solvent, preferably a polar, aprotic solvent such as N-methylpyrrolidone, dimethylacetamide, dimethylformamide, tetrahydrofuran, cyclohexanone, γ-butyrolactone, or the like, in proper stoichiometric amounts. Generally, the diamine and diester diacyl halide are present in an approximately 1:1 molar ratio, with the amount of end-capping reagent Z—Ar(C≡C—$(L)_q-R^1)_n$ calculated from the Carothers equation to provide the desired molecular weight of the product. The oligomeric compound (I) so provided preferably has a number average molecular weight (Mn) of about 5000 to 20,000 g/mol. Compound (I) can be isolated and purified using conventional techniques known to those skilled in the art.

An example of a specific compound of structural formula (I) is as follows:

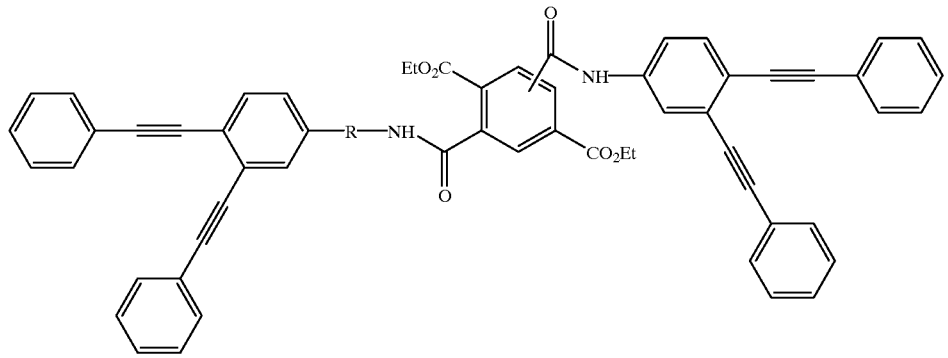

wherein R is

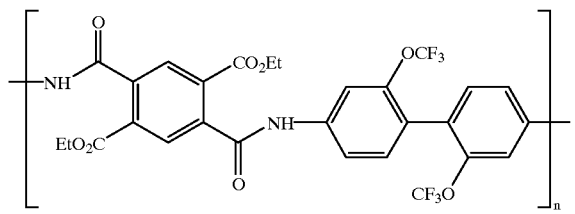

and, as may be seen, the polyamic ester substituent is ethyl.

Dielectric Compositions:

The oligomeric precursor compound having the structural formula (I) is readily converted to a dielectric material by heating to a suitable temperature to bring about imidization of the oligomeric segment R, chain extension, and crosslinking at the end-capped termini. This reaction may be conducted neat or in a solvent, preferably neat. Suitable solvents are those in which the oligomeric compound substantially dissolves and which has a viscosity convenient for coating, as in the manufacture of integrated circuits, the primary application herein, polymerization is conducted on a substrate. The solution will generally comprise from about 5 to 80, preferably 10 to 70, weight percent solids. Examples of suitable solvents include, for example N-methylpyrrolidone, dimethylacetamide, dimethylformamide, diphenylether, and the like. When polymerization is conducted in a solvent, crosslinking and chain extension are controlled to maintain polymer solubility (B-staging of thermosets).

The time, temperature and heating rate that are most advantageous in the imidization, chain extension, and crosslinking process will vary, depending on the specific oligomeric precursor used. In general, the oligomer is heated to a temperature of at least about 250° C. to bring about imidization of the central oligomeric segment R, chain extension, and crosslinking of the end-capped termini, with the temperature maintained thereat for a time period of at least about 1 hour, and preferably for 2 hours or more. Then, crosslinking is effected at a higher temperature, preferably at least about 400° C., with the elevated temperature maintained for a time period of at least about 1 hour, and preferably for 2 hours or more.

This imidization and crosslinking step is preferably conducted on a substrate. In such a case, the oligomeric precursor compound (I) may be applied to a substrate using any number of techniques, e.g., solution deposition, dip coating, spin coating, spray coating, doctor blading, or the like. The substrate on which polymerization may be conducted can be any material that has sufficient integrity to be coated with the oligomeric precursor and thermal stability to withstand the elevated temperatures used in the polymerization process. Representative examples of substrates include silicon, silicon dioxide, glass, silicon nitride, ceramics, aluminum, copper and gallium arsenide. Other suitable substrates will be known to those skilled in the art. In a multilayer integrated circuit device, an underlying layer of insulated circuit lines can also function as a substrate.

The dielectric composition so prepared, typically present as a layer on a substrate, has a dielectric constant less than 3.0 and more preferably less than 2.8 at 80° C. The dielectric composition has a low thermal expansion coefficient at elevated temperatures (e.g., less than about $10^{-3°}$ C.$^{-1}$ (i.e., 1000 ppm) at 450° C., preferably less than about $5 \times 10^{-4°}$ C.$^{-1}$, more preferably less than about $10^{-4°}$ C.$^{-1}$, to avoid film cracking during subsequent thermal process steps. The dielectric composition has enhanced mechanical and polishing characteristics, improved isotropic optical properties, and enhanced dielectric properties. The composition also has thermal stress of less than 100 MPa, preferably less than 50 MPa. Further, the dielectric composition has mechanical properties that enable it to be chemically/mechanically planarized to facilitate lithographic formation of multiple circuit levels in multilevel integrated circuit devices. The dielectric composition has increased breakdown voltage, enhanced toughness, and increased crack resistance, even in high ambient humidity and in a thick film. The dielectric composition is optically clear and adheres well to substrates. The composition undergoes minimal shrinkage during heating, typically less than about 10%.

Integrated Circuit Devices:

The primary use of the novel dielectric compositions is in the manufacture of integrated circuit devices. An integrated circuit device according to the present invention is exemplified in FIG. 1, wherein the device is shown as comprising substrate 2, metallic circuit lines 4, and a dielectric material 6 of the present invention. The substrate 2 has vertical metallic studs 8 formed therein. The circuit lines function to distribute electrical signals in the device and to provide power input to and signal output from the device. Suitable integrated circuit devices generally comprise multiple layers of circuit lines that are interconnected by vertical metallic studs.

Suitable substrates 2 comprise silicon, silicon dioxide, glass, silicon nitride, ceramics, aluminum, copper, and gallium arsenide. Suitable circuit lines generally comprise a metallic, electrically conductive material such as copper, aluminum, tungsten, gold or silver, or alloys thereof. Optionally, the circuit lines may be coated with a metallic liner such as a layer of nickel, tantalum or chromium, or with other layers such as barrier or adhesion layers (e.g., SiN, TiN, or the like).

Figure 2:
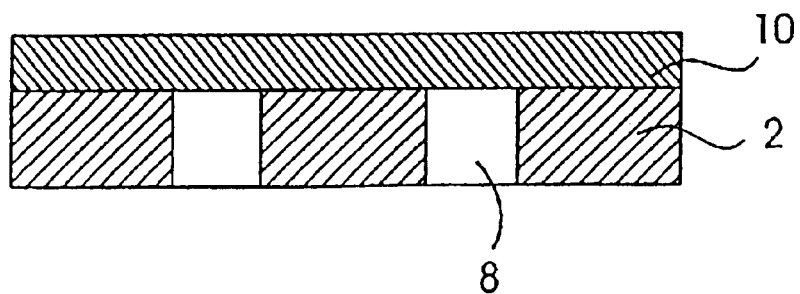
FIGS. 2–5 show a process for making an integrated circuit device of the present invention.

The invention also relates to processes for manufacturing integrated circuit devices containing a dielectric composition as described and claimed herein. Referring to FIG. 2, the first step of one process embodiment involves disposing on a substrate 2 a layer 10 of an oligomeric precursor compound of the invention such as a bis-phenylacetylene end-capped polyamic ester. The oligomeric precursor is dissolved in a suitable solvent such as dimethylpropylene urea ("DMPU"), N-methylpyrrolidone, or the like, and is applied to the substrate by art-known methods such as spin- or spray-coating or doctor blading. The solution uniquely has high solids content (e.g. 40–50%) which leads to enhanced planarization. The precursor compound is then thermally treated as described in the preceding section so as to bring about imidization, chain extension and crosslinking, thus converting layer 10 to a dielectric composition.

Figure 3:
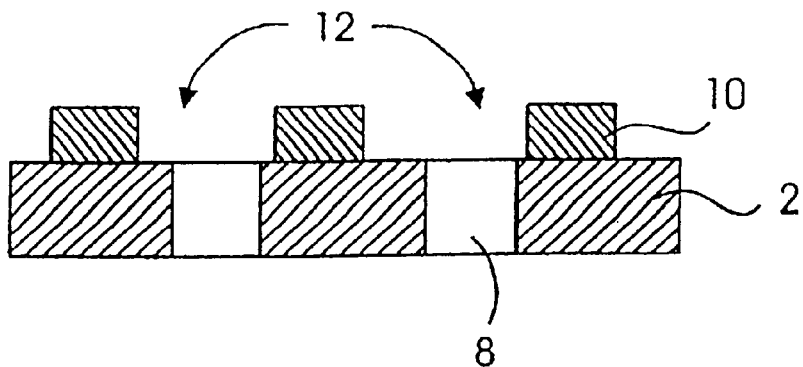

Referring to FIG. 3, the third step of the process involves lithographically patterning the layer 10 of dielectric composition to form trenches 12 (depressions) therein. The trenches 12 shown in FIG. 3 extend to the substrate 2 and to the metallic studs 8. Lithographic patterning generally involves: (i) coating the layer 10 of the dielectric composition with a positive or negative photoresist such as those marketed by Shipley or Hoechst Celanese, (AZ photoresist); (ii) imagewise exposing (through a mask) the photoresist to radiation such as electromagnetic, e.g., UV or deep UV; (iii) developing the image in the resist, e.g., with suitable basic developer; and (iv) transferring the image through the layer 10 of dielectric composition to the substrate 2 with a suitable transfer technique such as reactive ion blanket or beam etching (RIE). Suitable lithographic patterning techniques are well known to those skilled in the art such as disclosed in *Introduction to Microlithography,* 2nd Ed., eds. Thompson et al. (Washington, D.C.: American Chemical Society, 1994).

Figure 4:
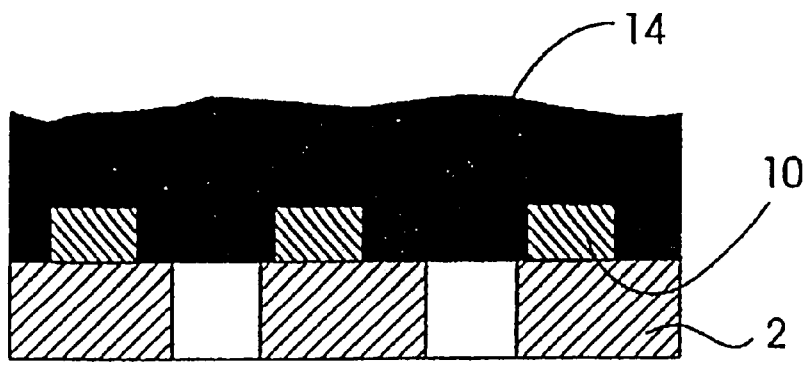

Referring to FIG. 4, in the fourth step of the process for forming an integrated circuit of the present invention, a metallic film 14 is deposited onto the patterned dielectric layer 10. Preferred metallic materials include copper, tungsten, and aluminum. The metal is suitably deposited onto the patterned dielectric layer by art-known techniques such as chemical vapor deposition (CVD), plasma-enhanced CVD, electro and electroless deposition (seed-catalyzed in situ reduction), sputtering, or the like.

Figure 5:
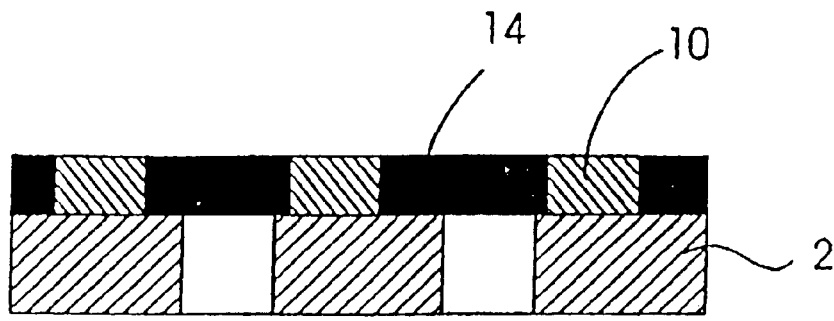

Referring to FIG. 5, the last step of the process involves removal of excess metallic material by "planarizing" the metallic film 14 so that the film is generally level with the patterned dielectric layer 10. Planarization can be accomplished using chemical/mechanical polishing or selective wet or dry etching. Suitable methods for chemical/mechanical polishing are known to those skilled in the art.

Figure 6:
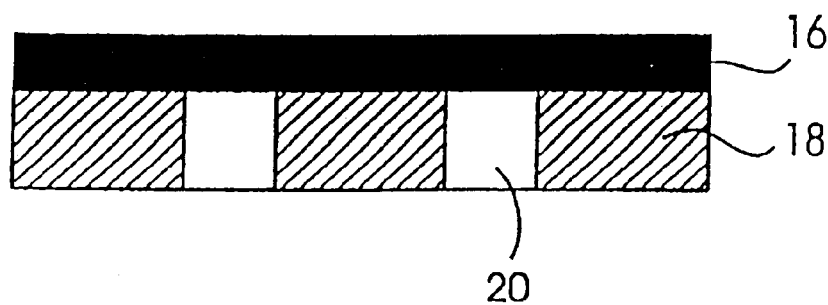
FIGS. 6–8 show an alternative process for making an integrated circuit device of the present invention.
Figure 7:
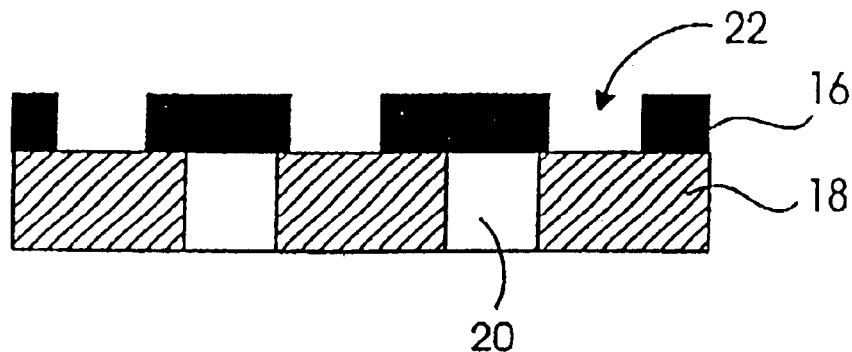
Figure 8:
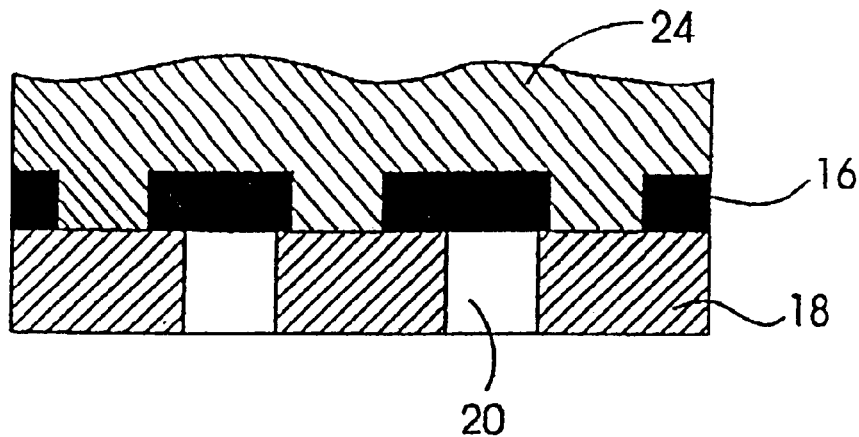

Referring to FIGS. 6–8, there is shown an alternative process for making an integrated circuit device of the invention. The first step of the process in this embodiment involves depositing a metallic film 16 onto a substrate 18. Substrate 18 is also provided with vertical metallic studs 20. Referring to FIG. 7, in the second step of the process, the metallic film is lithographically patterned through a mask to form trenches 22. Referring to FIG. 8, in the third step of the process, a layer 24 of an oligomeric precursor compound of the invention is deposited onto the patterned metallic film 16. In the last step of the process, the oligomeric precursor compound is heated to imidize the oligomeric central segment and crosslink the precursor's termini; imidization and crosslinking (curing) result in a dielectric material. Optionally, the dielectric layer may then be planarized, if necessary, for subsequent process in a multilayer integrated circuit.

The invention additionally relates to an integrated circuit packaging device (multichip module) for providing signal and power current to one or more integrated circuit chips comprising: (i) a substrate having electrical conductor means for connection to a circuit board; (ii) a plurality of alternating electrically insulating and conducting layers positioned on the substrate wherein at least of the layers comprises a film of a dielectric material of the present invention; and (iii) a plurality of vias for electrically interconnecting the electrical conductor means, conducting layers and integrated circuit chips.

The integrated circuit packaging device represents an intermediate level of packaging between the integrated circuit chip and the circuit board. The integrated circuit chips are mounted on the integrated circuit packaging device which is in turn mounted on the circuit board.

The substrate of the packaging device is generally an inert substrate such as glass, silicon or ceramic; suitable inert substrates also include epoxy composites, polyimides, phenolic polymers, high temperature polymers, and the like. The substrate can optionally have integrated circuits disposed therein. The substrate is provided with electrical conductor means such as input/output pins (I/O pins) for electrically connecting the packaging device to the circuit board. A plurality of electrically insulating and electrically conducting layers (layers having conductive circuits disposed in an dielectric insulating material) are alternatively stacked up on the substrate. The layers are generally formed on the substrate in a layer-by-layer process wherein each layer is formed in a separate process step.

The packaging device also comprises receiving means for receiving the integrated circuit chips. Suitable receiving means include pinboards for receipt of chip I/O pins or metal pads for solder connection to the chip. Generally, the packaging device also comprises a plurality of electrical vias generally vertically aligned to electrically interconnect the I/O pins, the conductive layers and integrated circuit chips disposed in the receiving means. The function, structure and method of manufacture of such integrated circuit packaging devices are well known to those skilled in the art, as disclosed, for example in U.S. Pat. Nos. 4,489,364, 4,508, 981, 4,628,411 and 4,811,082.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experimental:

The following examples are put forth so as to provide those of ordinary skill in the art with a complete disclosure and description of how to prepare and use the oligomers and polymers disclosed and claimed herein. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

EXAMPLE 1

This example describes synthesis of ortho-bis (phenylethynyl)phenyl end-capped poly(amic ethyl ester).
(a) Synthesis of 3,4-Diiodophenylamine:

A 3-neck 1000 mL flask fitted with a water condenser, an overhead stirrer and under nitrogen, was charged with 3-iodophenylamine (74.92 g, 0.34 mol). 300 mL of ethanol (EtOH) was added and the 3-iodophenylamine dissolved with stirring. To the solution, mercury (II) oxide (HgO) (55.57 g, 0.26 mol) was added, the resulting bright orange solution was kept under nitrogen. With continues stirring, iodine (12)(86.82 g, 0.34 mol) was introduced in 10 g increments. The dark orange solution was heated to 50° C. and was left stirring under nitrogen for 24 hours.

The resulting brown solution with dark brown precipitate was dissolved in ethyl acetate (EtAc) and was filtered through celite. The solution was concentrated and extracted with EtAc/sodium bisulfate/brine. The organic layer was collected and dried over anhydrous magnesium sulfate. The crude product was subjected to flash chromatography using EtAc/hexane 1:3 as the eluent. The solvent was evaporated on a rotary evaporator yielding black crystals. The product recystallized from EtOH and water yielding 20.78 g white crystals (17.6%).

(b) Synthesis of 3,4-Bis(phenylethynyl)phenylamine:

In a 500 mL round bottom flask, dissolved 3,4-diiodophenylamine (15.31 g, 44.39 mmol) in 30 ml of acetonitrille (CH$_3$CN), followed by the addition of pyridine (5.43 g, 68.66 mmol). To the resulting orange solution, trifluoroacetic anhydride (15.30 g, 72.84 mmol) was slowly added with stirring. The solution was allowed to stir for 1 hour. The solution was poured into a 2 L beaker containing 1.5 L ice water. The resulting suspension was vacuum filtered, washed with water and allowed to air dry. The pink solid was then transferred into a tarred round bottom flask and was dried under high vacuum, to obtain 19.44 g (99%) of N-(3,4-diiodophenyl)-2,2,2-trifluoroethanamide as a pink solid. N-(3,4-diiodophenyl)-2,2-2-trifluoroethanamide (19.0 g, 43.09 mmol) was transferred into a 3 neck 250 mL round bottom flask and dissolved in phenyl acetylene (13.14 g, 14.13 mL, 128.68 mmol) with 50 ml of triethylamine (Et$_3$N), followed by the addition of triphenyl phosphine (2.25 g, 8.57 mmol) as a solid. The solution was cooled to −77C., under argon. The resulting orange solution was allowed to warm up to room temperature and while under an argon flow, a catalytic amount of copper iodide (CuI) (0.35 g, 1.71 mmol) and bis-triphenyl phospine palladium (II) chloride ((((C$_6$H$_5$)$_3$P)$_2$)Cl$_2$) (1.20 g, 1.71 mmol) with 50 mL Et$_3$N was added. The solution was heated to 80° C. with stirring for 12 hours. The dark brown solution was cooled then extracted into ethyl acetate with dilute HCl and brine. The solvent was removed and the crude product was purified by flash chromatography using 20% EtAc in hexane as eluent. A mixture of 4.27 g of the trifluoroacetamide-protected product, a light brown solid, and 7.91 g of 3,4-bis(phenylethynyl)phenylamine (88%), a viscous brown oil, were isolated. The protected product could be quantitatively converted to the desired product by reacting it with a aqueous potassium carbonate solution.

(3) Synthesis of Ortho-bis(phenylethynyl)phenyl end-capped poly(amic ethyl ester), 5K oligomer:

A 50 mL three-neck flask fitted with an overhead stirrer was charged with 0.26 g (0.88 mmol) of 3,4-bis (phenylethynyl)phenylamine, 3.44 g (1.21 mmol) of 3,3'-bis (trifluoromethoxy)benzidine (TFMOB) and 17 ml N-methyl-2-pyrrolidinone (NMP). The flask was heated with stirring under an argon stream in order to dissolve the diamine. After a homogeneous solution was obtained the flask was cooled to 5° C. and a solution of 1.35 g (3.88 mmol) of 4,6-dicarbethoxyisophthalic diacylchloride (m-PMDA) in 15 mL of TUF was added dropwise. The solution was allowed to warm to room temperature and stir for 24 h. The resulting viscous poly(amic ethyl ester) solution was precipitated into methanol/water (1:1) filtered and washed with water 3×, methanol 2× and hexane. The oligomer powder was vacuum dried to constant weight, 2.5 g (~98%). Molecular weight (5K) was evaluated by GPC, NMR and intrinsic viscosity measurements.

EXAMPLE 2

Film Formation:

The poly(amic ethyl ester) oligomer from Example 1 was dissolved in NMFP. A clear solution was formed with a solids content of 45 wt. %. The solution was subsequently cast by spin coating onto glass plates to form films from 1 to 10 microns thick. The imidization was accomplished by heating the polymer films for 1 hr. each at 200° C., 300° C. and 400° C. under an N$_2$ atmosphere. The cured polyimide films were subsequently cooled, slowly, to room temperature. The cured polyimide were crack-free, exhibited a dielectric constant of about 3.0 at 80° C., thermal stress of about 45 Mpa, and a thermal expansion coefficient at 450° C. of 75×10$^{-6}$.

What is claimed is:

1. A process for forming an integrated circuit, comprising:
   (a) providing a substrate having metallic studs dispersed throughout;
   (b) depositing a solution of an oligomeric precursor onto the substrate to form a coating thereon, the oligomeric precursor having the structural formula (I)

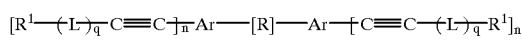

(I)

wherein
   n is an integer of 2 or more,
   q is 0 or 1,
   R is an oligomeric unit comprised of polybenzoxazole, polybenzothiazole, polyamic acid or a polyamic acid ester,
   R$^1$ is an aromatic group optionally substituted at one or more available carbon atoms with an inert, nonhydrogen substituent,
   L is a linking group, and
   Ar is arylene optionally substituted at one or more available carbon atoms with an inert, nonhydrogen substituent;
   (c) heating the coating to imidize and crosslink the oligomeric precursor, thereby forming a dielectric coating;
   (d) lithographically patterning the dielectric coating to form a patterned dielectric layer; and
   (e) depositing a metallic film onto the patterned dielectric layer.

2. The process of claim 1, wherein in (c), the coating is heated to a temperature of at least about 250° C.

3. The process of claim 2, wherein in (c), the coating is heated to a temperature of at least about 400° C.

4. The process of claim 1, wherein the substrate is comprised of a ceramic material.

5. The process of claim 1, wherein the substrate is comprised of silicon, silicon dioxide, glass, silicon nitride, aluminum, copper or gallium arsenide.

6. The process of claim 1, wherein the solution used in (b) has a solids content in the range of approximately 40% to 50%.

7. The process of claim 1, wherein the metallic film deposited in (e) is comprised of copper, tungsten, or aluminum.

8. The process of claim 1, further comprising (f) planarizing the metallic film deposited in step (e).

9. The process of claim 1, wherein (d) is carried out by:
(d1) depositing a photoresist onto the dielectric coating;
(d2) imagewise exposing the photoresist to radiation; and
(d3) developing the exposed photoresist to provide an image therein.

10. The process of claim 9, further including (d4) transferring the image to the substrate.

11. The process of claim 10, wherein said transferring is carried out using reactive ion etching.

12. The process of claim 1, wherein in the oligomeric precursor, n is 2 and q is zero.

13. The process of claim 12, wherein in the oligomeric precursor, R is a polyamic acid ester.

14. The process of claim 13, wherein R comprises the reaction product of:
(a) a diamine; and
(b) a diester diacyl halide formed from reaction of a tetracarboxylic dianhydride with a lower alkanol and a halogenating reagent.

15. The process of claim 14, wherein the diamine has the structural formula $H_2N-R^2-NH_2$ in which $R^2$ is a difunctional monocyclic or bicyclic aromatic moiety, and the tetracarboxylic dianhydride has the structural formula

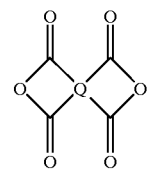

wherein Q is a tetrafunctional monocyclic, bicyclic or tricyclic aromatic moiety.

* * * * *